United States Patent
Lin et al.

(10) Patent No.: US 10,726,752 B2
(45) Date of Patent: Jul. 28, 2020

(54) ARRAY SUBSTRATE AND MANUFACTURING METHOD, AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zijin Lin, Beijing (CN); Haisheng Zhao, Beijing (CN); Xiaoguang Pei, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/572,156

(22) PCT Filed: Jun. 1, 2017

(86) PCT No.: PCT/CN2017/086845
§ 371 (c)(1),
(2) Date: Nov. 6, 2017

(87) PCT Pub. No.: WO2017/215451
PCT Pub. Date: Dec. 21, 2017

(65) Prior Publication Data
US 2019/0096299 A1    Mar. 28, 2019

(30) Foreign Application Priority Data

Jun. 17, 2016 (CN) .......................... 2016 1 0438382

(51) Int. Cl.
*G09G 3/00* (2006.01)
*G02F 1/13* (2006.01)
(Continued)

(52) U.S. Cl.
CPC ............ *G09G 3/006* (2013.01); *G02F 1/1309* (2013.01); *G02F 1/136204* (2013.01); *H01L 27/1214* (2013.01)

(58) Field of Classification Search
CPC .. G01R 31/2635; G09G 3/006; G09G 3/3233; G09G 2330/12
See application file for complete search history.

(56) References Cited

U.S. PATENT DOCUMENTS 6,242,923 B1 * 6/2001 Scaman ............... G01R 31/281
                                                         324/529
8,083,561 B1 * 12/2011 Huang .............. G02F 1/136259
                                                         345/76
9,513,670 B2    12/2016 Chen et al.

FOREIGN PATENT DOCUMENTS

CN           205069631 U           3/2016

OTHER PUBLICATIONS

International Search Report and Written Opinion dated Aug. 30, 2017 in PCT/CN2017/086845.
1st Office Action dated Sep. 27, 2018 in 201610438382.5.

* cited by examiner

*Primary Examiner* — Tung X Nguyen
(74) *Attorney, Agent, or Firm* — Syncoda LLC; Feng Ma

(57) ABSTRACT

An array substrate is disclosed, which includes a substrate, at least one test line, an insulating layer, and an electrostatic shielding pattern. The at least one test line is disposed over the substrate. The insulating layer is disposed over the at least one test line. The electrostatic shielding pattern is disposed over, and insulated by the insulating layer from, the (Continued)

at least one test line in the array substrate. The electrostatic shielding pattern is configured to absorb, and guide out from the array substrate, static electricity to thereby avoid the static electricity from entering an interior of the array substrate via the at least one test line. A method for manufacturing the array substrate, and a display panel containing the array substrate are also provided in the disclosure.

17 Claims, 3 Drawing Sheets

(51) Int. Cl.
*G02F 1/1362* (2006.01)
*H01L 27/12* (2006.01)

ARRAY SUBSTRATE AND MANUFACTURING METHOD, AND DISPLAY PANEL

CROSS-REFERENCE TO RELATED APPLICATION

The present application claims priority to Chinese Patent Application No. 201610438382.5 filed on Jun. 17, 2016, the disclosure of which is hereby incorporated by reference in its entirety.

TECHNICAL FIELD

The present disclosure relates generally to the field of display technology, and more specifically relates to an array substrate, its manufacturing method, and a display panel containing the array substrate.

BACKGROUND

Usually after the manufacturing process of an array substrate, tests need to be conducted by means of at least one electrical testing instrument (e.g. an ArrayTester) to determine the yield rate of the manufacturing process and the rates for various defects, and so on.

A typical testing process as such is as follows: the array substrate is contacted with a probe of the test instruments, and a test signal is loaded onto at least one test line of the array substrate to thereby conduct the test. Herein the test line is specifically designed for the test during a designing stage of the whole array substrate.

In a subsequent process after the testing, a portion of the test line that is outside a cutting line is typically cut off via a cutting process, and only a portion of the test line that is inside the cutting line is remained. The array substrate formed by the cutting process is illustrated in FIG. 1.

After completing the manufacturing of the array substrate, typically an 8 KV anti-electrostatic test is conducted over the array substrate, which typically involves using an electrostatic gun to discharge to a designated region.

The test line is generally located at a testing region at an edge of the panel. Because the test line is exposed at a cross-section formed after the cutting process, it cannot be completely insulated.

As such, during the anti-electrostatic testing process, the electrostatic charges can enter into the panel through the cross-section of the test line and then discharge inside the internal circuit of the panel, which can in turn cause poor electrostatic discharge (ESD), resulting in a damage to the internal circuit and causing an abnormal display.

In order to address the issues as described above, it is conventionally designed such that the test line is configured to have a post-cutting cross-section arranged at a position as far as possible from the testing region.

However, due to the current trend for narrower bezels and the correspondingly increasing complexity of circuits in current display panels, there is less and less margin that allows for the configuration of the test line in the array substrates, and as such, the conventional strategy of separation is not able to sufficiently address the anti-electrostatic needs.

SUMMARY

The present disclosure provides an array substrate, its manufacturing method, and a display panel containing the array substrate, aiming at addressing the issues as mentioned above.

In a first aspect, an array substrate is disclosed herein. The array substrate includes a substrate, at least one test line, an insulating layer, and an electrostatic shielding pattern.

The at least one test line is disposed over the substrate; the insulating layer is disposed over the at least one test line; and the electrostatic shielding pattern is disposed over the at least one test line in the array substrate, and is further insulated by the insulating layer from the at least one test line. The electrostatic shielding pattern is configured to absorb, and guide out from the array substrate, static electricity to thereby avoid the static electricity from entering an interior of the array substrate via the at least one test line.

According to some embodiments of the array substrate, the electrostatic shielding pattern includes a main portion and an electrostatic out-guiding portion. The main portion is electrically coupled to the electrostatic out-guiding portion, and the electrostatic out-guiding portion is configured to adaptively connect to a drive circuit and to guide out the static electricity to the drive circuit.

According to some embodiments, the electrostatic shielding pattern further includes a tip portion, which is disposed over the main portion, and is configured to absorb the static electricity.

In the embodiments of the array substrate as described above, the tip portion can include at least one first tip. The at least one first tip is disposed over, and electrically coupled with, an upper surface of the main portion, and is configured to absorb the static electricity.

The tip portion can include at least one second tip, which is disposed on one side of the main portion flush with a cutting edge of the array substrate, and can include at least one burr.

In any of the embodiments of the array substrate having a tip portion in the electrostatic shielding pattern, the tip portion can have a composition of a metal or an alloy, and can comprise, for example, at least one of silver or copper.

According to some embodiments of the array substrate, the electrostatic shielding pattern comprises a conductive material, which can be a metal or an alloy.

In some embodiments of the array substrate, the electrostatic shielding pattern is disposed at a source-drain electrode layer.

In some embodiments of the array substrate, the at least one test line is disposed at a gate electrode layer; and the insulating layer is disposed at a gate insulating layer.

The array substrate can further include a passivation layer, which is disposed over the electrostatic shielding pattern. The passivation layer is configured to partially expose the electrostatic shielding pattern to thereby allow a tip portion to be disposed on the electrostatic shielding pattern.

In a second aspect, a display panel is further disclosed. The display panel includes an array substrate according to any one of the embodiments as mentioned above.

The display panel can further include a drive circuit, which is adaptively coupled to the array substrate such that the drive circuit can absorb and discharge the static electricity that is absorbed by, and guided out from, the electrostatic shielding pattern in the array substrate.

Herein the drive circuit can be adaptively coupled to the array substrate through an electrostatic out-guiding portion of the electrostatic shielding pattern in the array substrate.

Furthermore, the drive circuit can include an electrostatic discharge subcircuit, which is configured to absorb and discharge the static electricity absorbed by, and guided out from, the electrostatic shielding pattern in the array substrate. The electrostatic discharge subcircuit as described above can be a grounding subcircuit.

In a third aspect, the present disclosure further provides a method for manufacturing an array substrate. The method includes the following steps:

forming at least one test line over a substrate;

forming an insulating layer over the at least one test line; and forming an electrostatic shielding pattern over the insulating layer;

Herein the electrostatic shielding pattern is configured to absorb, and guide out, static electricity from the array substrate to thereby avoid the static electricity from entering an interior of the array substrate via the at least one test line.

According to some embodiments, the method further includes a step of forming a passivation layer over the electrostatic shielding pattern, wherein the passivation layer is configured to partially expose the electrostatic shielding pattern to thereby allow a tip portion to be disposed on a main portion of the electrostatic shielding pattern for absorbing the static electricity.

On the above basis, the method further includes a step of forming the tip portion on the main portion of the electrostatic shielding pattern. The tip portion is configured to absorb the static electricity from the array substrate.

In addition, between the step of forming a passivation layer over the electrostatic shielding pattern and the step of forming the tip portion on the main portion of the electrostatic shielding pattern, the method can include a step of processing the passivation layer such that an upper surface of the electrostatic shielding pattern is partially exposed to allow the tip portion to be disposed thereon.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides an array substrate.

Figure 1:
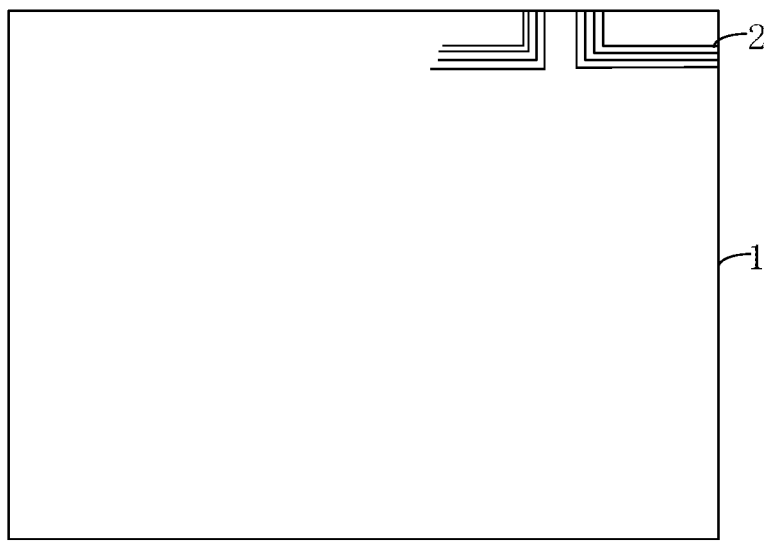
FIG. 1 is a schematic diagram of an array substrate according to an existing technology.
Figure 2:
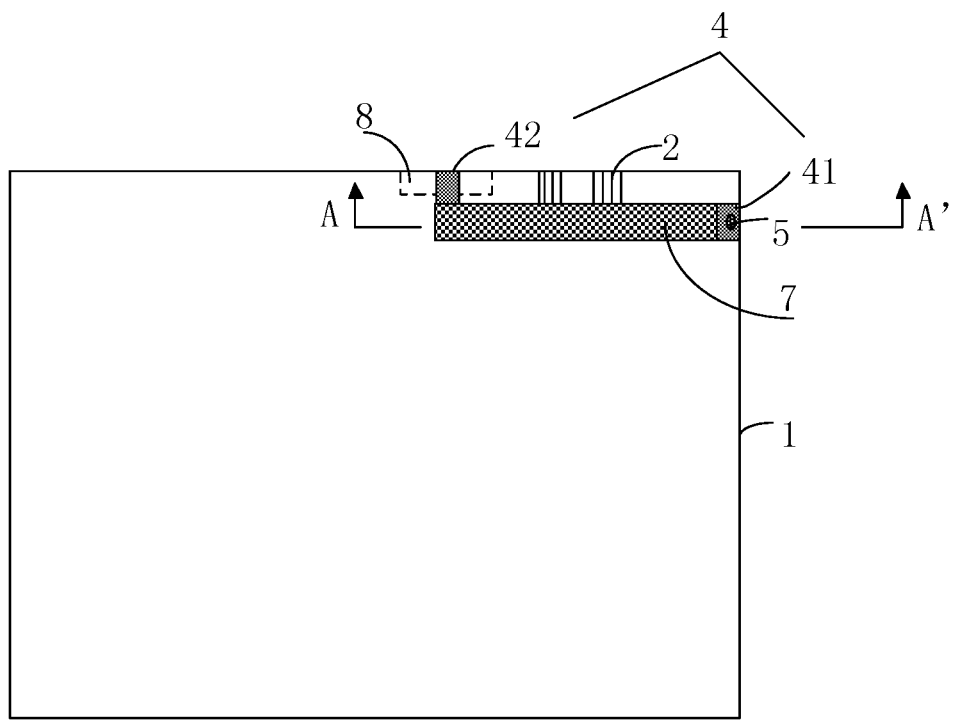
FIG. 2 is a structural diagram of an array substrate according to some embodiments of the present disclosure.
Figure 3:
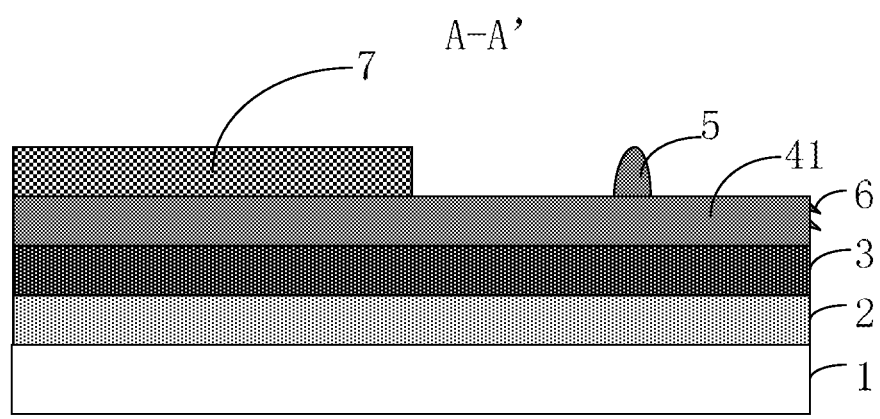
FIG. 3 is a sectional view of FIG. 2 along the A-A' line.
Figure 4:
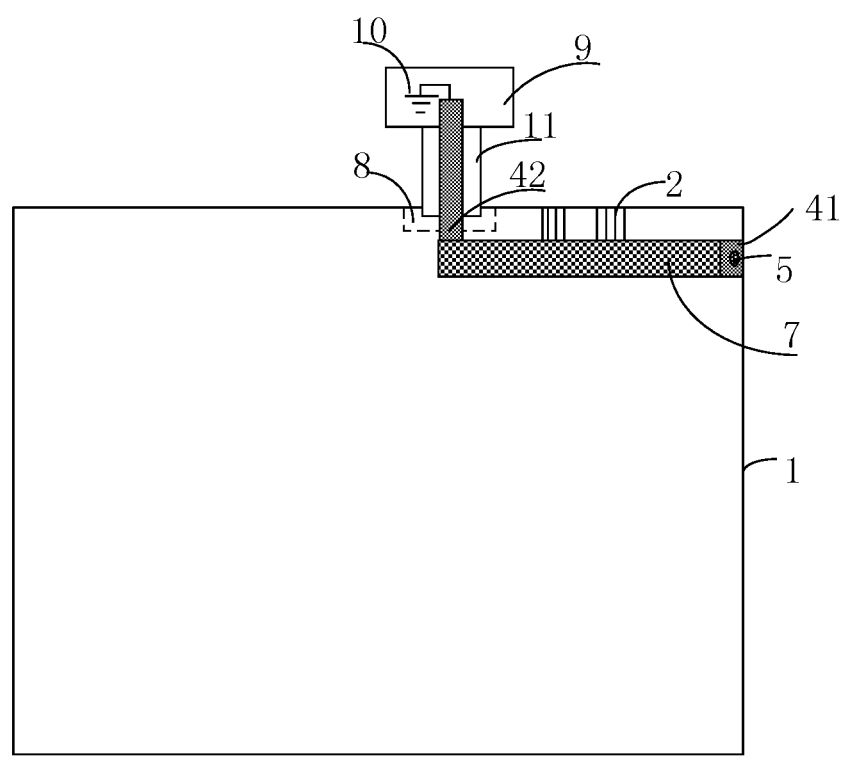
FIG. 4 is a structural diagram of a display panel according to some embodiments of the present disclosure.

FIG. 2, FIG. 3 and FIG. 4 illustrate an array substrate according to some embodiments of the present disclosure. As shown in the figures, the array substrate comprises a substrate 1, at least one test line 2, an electrostatic shielding pattern 4, and an insulating layer 3.

The at least one test line 2 is disposed over the substrate 1; the electrostatic shielding pattern 4 is disposed over the at least one test line 2; and the insulating layer 3 is disposed between the electrostatic shielding pattern 4 and the at least one test line 2.

The electrostatic shielding pattern 4 comprises a main portion 41 and an electrostatic out-guiding portion 42. The electrostatic out-guiding portion 42 is electrically coupled to the main portion 41 and extends to an adapting region 8 of the array substrate, and is configured to allow a drive circuit 9 to press-fit with, and to thereby electrically connect, the array substrate via the adapting region 8.

The electrostatic shielding pattern 4 is disposed at a source-drain electrode layer.

The array substrate further comprises a tip portion, which is disposed over the main portion 41 of the electrostatic shielding pattern 4 and is configured for absorbing static electricity.

The tip portion can comprise at least one first tip 5, which is disposed over, and configured to be electrically coupled with, an upper surface of the main portion 41. Herein the upper surface of the main portion 41 is referred to as a surface of the main portion 41 that is far away from the substrate 1, and accordingly a lower surface of the main portion 41 is referred to as a surface of the main portion 41 that is close to the substrate 1.

One side of the main portion 41 is configured to be flush with an edge of the array substrate, and the tip portion can further comprise at least one second tip 6, which is disposed over, and configured to be electrically coupled with, the one side of the main portion 41. Herein the side of the main portion 41 is referred to as a lateral side of the main portion 41 that is relative to the upper surface and the lower surface of the main portion 41.

In the embodiments of the array substrate as described above, the electrostatic shielding pattern 4 is disposed over the at least one test line 2, and the electrostatic shielding pattern 4 comprises the electrostatic out-guiding portion 42.

As such, when an electrostatic test over the array substrate is carried out, the main portion 41 of the electrostatic shielding pattern 4 can prioritizingly absorb the static charges, which can then be guided to the drive circuit 9 that is connected to the array substrate through the electrostatic out-guiding portion 42.

Consequently, the amount of electrostatic charges that enter into the interior of the array substrate via a cross-section of the at least one test line 2 can be reduced, resulting in a reduced occurrence of the poor electrostatic discharge, and leading to a reduced damage to the internal circuit and a reduced abnormal display.

In practice, the electrostatic shielding pattern 4 can have a composition of any type of a conductive material, for example a metal. In practical applications, it can be selected according to specific needs, and there are no limitations herein.

It is noted that in order for the electrostatic out-guiding portion 42 of the array substrate to adaptively connect to the drive circuit 9 to be connected to the array substrate, a length and a width of the electrostatic out-guiding portion 42 need to be configured to allow an adaptive connection between the electrostatic out-guiding portion 42 and the aforementioned drive circuit 9.

It is further noted that the adapting region 8 is referred to as a region where a circuit outside the array substrate can be adaptively connected, to the array substrate. Herein, the circuit can be adaptively connected to the adapting region by any approaches. In one example as shown in FIG. 4, the drive circuit 9 can be crimped, or adaptively connected, to the adapting region 8 of the array substrate through a chip-on-film 11.

In practice, any approaches can be employed for absorbing the electrostatic charges that are attracted to the drive circuit 9 that is adaptively connected to the array substrate.

One of the approaches is illustrated in FIG. 4, wherein the electrostatic out-guiding portion 42 can be electrically connected with a grounding subcircuit 10 of the drive circuit 9 that is adaptively connected to the array substrate, so as to absorb the electrostatic charges to thereby avoid the occurrence of a secondary discharge on other circuits in the array substrate due to the accumulation of static electricity.

Other approaches can also be employed over the drive circuit 9 to absorb the electrostatic charges, for example, by absorbing the electrostatic charges by means of an electrostatic discharge subcircuit on the drive circuit 9. There are no limitations herein.

In the embodiments of the array substrate as described above, the electrostatic shielding pattern 4 can be disposed at a same layer as the source-drain electrode layer. The advantages are as follows:

The electrostatic shielding pattern 4 can be fabricated via a same manufacturing process as the source electrodes and the drain electrodes of the thin film transistors, and as such, the fabrication process can be easy and simplified.

In addition, the at least one test line 2 can be disposed at a same layer as a gate electrode layer, and the insulating layer 3 can be disposed at a same layer as a gate insulating layer. As such, the at least one test line 2 can be fabricated via a same process as the gate electrodes of the thin film transistors, and the insulating layer 3 can be fabricated together with the gate insulating layer of the thin film transistors. The fabrication process as such can be further simplified.

It is noted that in some alternative embodiments, the electrostatic shielding pattern 4 does not need to be disposed at the source-drain electrode layer, the at least one test line 2 does not need to be disposed at the gate electrode layer, and the insulating layer 3 does not need to be disposed at the gate insulating layer, as long as the electrostatic shielding pattern 4 can absorb electrostatic charges in the anti-electrostatic test, and as long as the location of the at least one test line 2 allows the testing to be realized after the manufacturing of the array substrate. There are no limitations herein.

In the embodiments of the array substrate as described above, because the at least one first tip 5 is disposed over, and configured to be electrically coupled with, the upper surface of the main portion 41 in the electrostatic shielding pattern 4, it is advantageous for the abortion of the electrostatic charges, which can further reduce the amount of the electrostatic charges entered into the interior of the array substrate from the cross-section of the at least one test line 2.

In practical implementation, the at least one first tip 5 can be formed after the manufacturing of each layer over the array substrate, to thereby prevent the at least one first tip 5 from damaging any of the layers (e.g., the passivation layer as shown in the figure) disposed over the electrostatic shielding pattern 4 during the manufacturing process of the array substrate.

During the formation of the at least one first tip 5, it can be manufactured through a pasting process, or through any other processes.

It is noted that before formation of the at least one first tip 5, the passivation layer 7 disposed over the electrostatic shielding pattern 4 needs to be at least partially hollowed by, for example, an etching process, to ensure that the upper surface of the electrostatic shielding pattern 4 is at least partially exposed before the at least one first tip 5 is formed.

The at least one first tip 5 can have a composition selected according to practical needs. For example, it can be silver, copper, etc. There are no limitations herein.

In some alternative embodiments, there is no need to dispose the at least one first tip 5 over the upper surface of the electrostatic shielding pattern 4. The absorption of the electrostatic charges can be realized through other approaches, as long as the aforementioned purposes can be achieved. These approaches and their technical solutions shall also fall into the scope of the protection of the present disclosure.

In specific implementations, the at least one second tip 6 can comprise at least one burr formed during a cutting process. As a matter of fact, during the cutting process, the at least one test line 2 and the electrostatic shielding pattern 4 are cut together, thus the cross-section of the electrostatic shielding pattern 4 is supposed to be flush with the cross-section of the at least one test line 2.

It is noted that during the cutting process as mentioned above, at least one burr can almost inevitably be formed over the cross-section of the electrostatic shielding pattern 4. The presence of the at least one burr is advantageous for the absorption of the electrostatic charges.

It is noted that in some alternative embodiments, there is no need to form the at least one second tip 6 over the electrostatic shielding pattern 4, and other approaches can also be employed to form the at least one second tip 6, as long as the technical solutions of these methods can still achieve the aforementioned purposes. These alternative methods shall also fall into the scope of protection of the present disclosure.

In the embodiments of the array substrate as described above, because it is configured such that one side of the electrostatic shielding pattern 4 is flush with the edge of the array substrate (i.e., the one side of the electrostatic shielding pattern 4 is flush with the cross-section of the at least one test line 2), and that the at least one second tip 6 is disposed over the side, such configuration is further beneficial for the absorption of the electrostatic charges, leading to a further reduction of the amount of electrostatic charges entering into the interior of the array substrate from the cross-section of the at least one test line 2.

In a second aspect, the present disclosure further provides a method for manufacturing an array substrate according to any one of the embodiments as described above.

Depending on the different structures of the array substrates, the manufacturing methods can vary accordingly.

According to some embodiments of the present disclosure, the manufacturing method of the array substrate disclosed in some embodiments as described above can comprise the following steps:

S101: forming a pattern of a gate electrode layer over a substrate 1, wherein the pattern of the gate electrode layer comprises at least one test line 2;

S102: forming an insulating layer 3 over the at least one test line 2;

S103: forming a pattern of a source-drain electrode layer over the insulating layer 3, wherein the pattern of the source-drain insulating layer comprises an electrostatic shielding pattern 4, wherein the electrode shielding pattern 4 comprises a main portion 41 and an electrostatic out-guiding portion 42; and the electrostatic out-guiding portion 42 is electrically coupled to the main portion 41 and extends to an adapting region 8, and is configured to allow an adaptive connection with a drive circuit 9;

S104: forming a passivation layer over the electrostatic shielding pattern 4;

S105: forming a tip portion over the main portion 41 of the electrostatic shielding pattern 4, wherein the tip portion is configured to discharge static electricity, and the tip portion comprises at least one first tip 105 and at least one second tip 106.

The array substrate in some of the above embodiments in the present disclosure can be manufactured through the manufacturing method as described above, and thus has the same technical effects as mentioned above. Description of the technical effects is skipped herein.

It is noted that according to some alternative embodiments of the array substrate, the at least one test line 2 in the array substrate is not disposed at the gate electrode layer, and the electrostatic shielding pattern 4 is not disposed at the source-drain electrode layer.

In the manufacturing method of the array substrate as such, the following steps (S101' and S103') can be carried out to substitute the original steps (S101 and S103 respectively):

S101': forming at least one test line 2 over the substrate 1. There is notably no limitation that the at least one test line 2 is contained in the pattern of the gate electrode layer; and S103': forming an electrostatic shielding pattern 4 over the insulating layer 3. There is notably no limitation that the electrostatic shielding pattern 4 is contained in the pattern of the source-drain electrode.

In another alternative embodiment of the array substrate, there is no tip portion configured over the electrostatic shielding pattern 4. Thereby the corresponding manufacturing method of the array substrate as such does not comprise step S105.

Because the array substrate may have varied structures depending on different embodiments of the present disclosure, different manufacturing methods having variations in any of the steps may be carried out to manufacture the array substrate as such. Detailed description of these different manufacturing methods is skipped herein.

In a third aspect, the present disclosure provides a display panel.

With reference to FIG. 4, the display panel can comprise a drive circuit 9, and an array substrate according to any one of the embodiments as described above.

Herein the drive circuit 9 is crimped, and adaptively connected, to the adapting region 8 of the array substrate. The drive circuit 9 comprises a grounding subcircuit 10, and the grounding subcircuit 10 is electrically coupled to the electrostatic out-guiding portion 42 in the electrostatic shielding pattern 4.

Because the display panel as described above comprises the aforementioned array substrate, the display panel has the same technical effects as the array substrate as described above. As such, detailed description of the technical effects for the display panel is not repeated herein.

Because the display panel as described above employs a grounding subcircuit 10 in the drive circuit 9 to extract the electrostatic charges absorbed by the electrostatic shielding pattern 4 of the array substrate, the display panel is simple and convenient.

Herein the display panel can be any products or components that have a display function, such as display panels, electronic papers, cellular phones, tablets, televisions, monitors, notebooks, digital photo frames, and navigators.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
a substrate;
at least one test line, disposed over the substrate;
an insulating layer, disposed over the at least one test line; and
an electrostatic shielding pattern, disposed over, and insulated by the insulating layer from, the at least one test line in the array substrate;
wherein:
the electrostatic shielding pattern is configured to absorb, and guide out from the array substrate, static electricity to thereby avoid the static electricity from entering an interior of the array substrate via the at least one test line;
the electrostatic shielding pattern comprises a main portion and an electrostatic out-guiding portion, wherein:
the main portion is electrically coupled to the electrostatic out-guiding portion; and
the electrostatic out-guiding portion is configured to adaptively connect to, and to guide out the static electricity to, a drive circuit.

2. The array substrate of claim 1, wherein the electrostatic shielding pattern further comprises a tip portion, wherein the tip portion is disposed over the main portion and is configured to absorb the static electricity.

3. The array substrate of claim 2, wherein the tip portion comprises at least one first tip, wherein:
the at least one first tip is disposed over, and electrically coupled with, an upper surface of the main portion, and is configured to absorb the static electricity.

4. The array substrate of claim 2, wherein the tip portion comprises at least one second tip, wherein the at least one second tip is disposed on one side of the main portion flush with a cutting edge of the array substrate.

5. The array substrate of claim 4, wherein the at least one second tip comprises at least one burr.

6. The array substrate of claim 2, wherein the tip portion comprises a metal or an alloy.

7. The array substrate of claim 1, wherein the electrostatic shielding pattern comprises a conductive material.

8. The array substrate of claim 1, wherein:
the at least one test line is disposed at a gate electrode layer; and
the insulating layer is disposed at a gate insulating layer.

9. An array substrate, comprising:
a substrate;
at least one test line, disposed over the substrate;
an insulating layer, disposed over the at least one test line; and an electrostatic shielding pattern, disposed over, and insulated by the insulating layer from, the at least one test line in the array substrate;

wherein:

the electrostatic shielding pattern is configured to absorb, and guide out from the array substrate, static electricity to thereby avoid the static electricity from entering an interior of the array substrate via the at least one test line; and the electrostatic shielding pattern is disposed at a source-drain electrode layer.

10. An array substrate, comprising:

a substrate;

at least one test line, disposed over the substrate;

an insulating layer, disposed over the at least one test line; and an electrostatic shielding pattern, disposed over, and insulated by the insulating layer from, the at least one test line in the array substrate;

wherein:

the electrostatic shielding pattern is configured to absorb, and guide out from the array substrate, static electricity to thereby avoid the static electricity from entering an interior of the array substrate via the at least one test line;

the array substrate further comprising a passivation layer disposed over the electrostatic shielding pattern, wherein the passivation layer is configured to partially expose the electrostatic shielding pattern to thereby allow a tip portion to be disposed on the electrostatic shielding pattern.

11. A display panel, comprising an array substrate including:

a substrate;

at least one test line, disposed over the substrate;

an insulating layer, disposed over the at least one test line; and an electrostatic shielding pattern, disposed over, and insulated by the insulating layer from, the at least one test line in the array substrate;

wherein:

the electrostatic shielding pattern is configured to absorb, and guide out from the array substrate, static electricity to thereby avoid the static electricity from entering an interior of the array substrate via the at least one test line;

the display panel further comprising a drive circuit, wherein the drive circuit is adaptively coupled to the array substrate such that the drive circuit can absorb, and discharge, the static electricity absorbed by, and guided out from, the electrostatic shielding pattern in the array substrate.

12. The display panel of claim 11, wherein the drive circuit is adaptively coupled to the array substrate through an electrostatic out-guiding portion of the electrostatic shielding pattern in the array substrate.

13. The display panel of claim 11, wherein the drive circuit comprises an electrostatic discharge subcircuit, configured to absorb and discharge the static electricity absorbed by, and guided out from, the electrostatic shielding pattern in the array substrate.

14. The display panel of claim 13, wherein the electrostatic discharge subcircuit is a grounding subcircuit.

15. A method for manufacturing an array substrate, comprising:

forming at least one test line over a substrate;

forming an insulating layer over the at least one test line; and forming an electrostatic shielding pattern over the insulating layer;

wherein:

the electrostatic shielding pattern is configured to absorb, and guide out, static electricity from the array substrate to thereby avoid the static electricity from entering an interior of the array substrate via the at least one test line;

the method further comprising:

forming a passivation layer over the electrostatic shielding pattern, wherein the passivation layer is configured to partially expose the electrostatic shielding pattern to thereby allow a tip portion to be disposed on a main portion of the electrostatic shielding pattern for absorbing the static electricity.

16. The method of claim 15, further comprising:

forming the tip portion on the main portion of the electrostatic shielding pattern, such that the tip portion can absorb the static electricity from the array substrate.

17. The method of claim 16, further comprising, between the forming a passivation layer over the electrostatic shielding pattern and the forming the tip portion on the main portion of the electrostatic shielding pattern:

processing the passivation layer such that an upper surface of the electrostatic shielding pattern is partially exposed to allow the tip portion to be disposed thereon.

* * * * *